(12) United States Patent
Koide et al.

(10) Patent No.: US 6,420,733 B2
(45) Date of Patent: *Jul. 16, 2002

(54) SEMICONDUCTOR LIGHT-EMITTING DEVICE AND MANUFACTURING METHOD THEREOF

(75) Inventors: Norikatsu Koide; Shinya Asami; Junichi Umezaki; Masayoshi Koike; Shiro Yamasaki; Seiji Nagai, all of Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/922,687

(22) Filed: Aug. 7, 2001

Related U.S. Application Data

(62) Division of application No. 09/497,814, filed on Feb. 3, 2000, which is a division of application No. 08/925,325, filed on Sep. 8, 1997, now Pat. No. 6,040,588.

(30) Foreign Application Priority Data

Sep. 8, 1996 (JP) .............................. 8-257819
Oct. 22, 1996 (JP) .............................. 8-299404

(51) Int. Cl.$^7$ .............................................. H01L 33/00
(52) U.S. Cl. ............................. 257/79; 257/88; 257/96; 257/103; 257/98; 257/627; 257/14
(58) Field of Search .................... 257/88, 96, 103, 257/98, 627, 628, 94, 14, 196, 201, 615, 79; 438/46

(56) References Cited

U.S. PATENT DOCUMENTS

| | | | |
|---|---|---|---|
| 5,684,309 A | | 11/1997 | McIntosh et al. |
| 5,751,013 A | | 5/1998 | Kodioguchi et al. |
| 5,777,350 A | | 7/1998 | Nakamura et al. |
| 5,793,054 A | | 8/1998 | Nido |
| 5,851,905 A | | 12/1998 | McIntosh |
| 5,945,689 A | * | 8/1999 | Koike et al. .................. 257/88 |
| 5,959,307 A | * | 9/1999 | Nakamura et al. ............. 257/14 |
| 5,959,401 A | * | 9/1999 | Asami et al. ................ 313/503 |
| 6,040,588 A | * | 3/2000 | Koide et al. .................. 257/15 |
| 6,072,197 A | * | 6/2000 | Horino et al. ............... 257/103 |
| 6,165,812 A | * | 12/2000 | Ishibashi et al. .............. 438/46 |

* cited by examiner

Primary Examiner—Caridad Everhart
Assistant Examiner—Igwe U. Anya
(74) Attorney, Agent, or Firm—Pillsbury Winthrop LLP

(57) ABSTRACT

In a method of manufacturing a semiconductor light-emitting device involving the steps of: forming a first semiconductor layer; forming a light-emitting layer of superlattice structure by laminating a barrier layer being made of $In_{Y1}Ga_{1-Y1}N$ ($Y1 \geq 0$) and a quantum well layer being made of $In_{Y2}Ga_{1-Y2}N$ ($Y2>Y1$ and $Y2>0$) on the first semiconductor layer; and forming a second semiconductor layer on the light-emitting layer, an uppermost barrier layer, which will become an uppermost layer of the light-emitting layer, is made thicker than the other barrier layers. Further, at the time of forming the second semiconductor layer, an upper surface of such uppermost barrier layer is caused to disappear so that the thickness of the uppermost barrier layer becomes substantially equal to those of the other barrier layers.

7 Claims, 5 Drawing Sheets

SEMICONDUCTOR LIGHT-EMITTING DEVICE AND MANUFACTURING METHOD THEREOF

This application is a divisional of U.S. application Ser. No. 09/497,814, filed Feb. 3, 2000, which is a divisional of U.S. Ser. No. 08/925,325, filed Sep. 8, 1997, now U.S. Pat. No. 6,040,588.

BACKGROUND OF THE INVENTION

1. Field of the Invention

The invention relates to a semiconductor light-emitting device and a method of manufacturing said semiconductor light-emitting device. The semiconductor light-emitting device can be utilized as, e.g., a light-emitting diode and a laser diode.

2. Description of the Related Art

Light-emitting devices using compound semiconductors are known as those covering visible to short wavelength regions. Among others, group III nitride semiconductors have attracted attention in recent years, not only because these semiconductors are of direct transition type, so that they exhibit high light-emitting efficiency, but also because these semiconductors emit blue light, which is one of the three primary colors.

One example of such light-emitting device is formed by laminating an AlN buffer layer, a first clad layer, a light-emitting layer, and a second clad layer sequentially on a sapphire substrate. Here, the first and the second clad layers are made of $Al_X In_Y Ga_{1-X-Y} N$ (including X=0, X=Y, X=Y=0). The light-emitting layer has a superlattice structure formed by laminating a barrier layer made of $In_{Y1} Ga_{1-Y1} N$ (Y1≧0) and a quantum well layer made of $In_{Y2} Ga_{1-Y2} N$ (Y2≧Y1 and Y2>0) repetitively.

These semiconductor layers are formed in accordance with an ordinary technique based on a metal organic vapor phase epitaxial growth method (hereinafter referred to as the "MOVPE method").

The thus superlattice-structured light-emitting layer, requiring steepness in difference of composition between the barrier layers and the quantum well layers, is formed at relatively low growth temperatures. Further, the respective barrier layers are generally formed to have the same thickness, and similarly the respective quantum well layers are formed to have the same thickness. This is because there is a danger that the wavelengths of light emitted from the respective quantum well layers will be slightly varied by the quantum effect if thicknesses differ between layers.

On the other hand, the second clad layer that is formed on the light-emitting layer is formed at higher temperatures than the light-emitting layer in order to meet thickness and composition requirements (the second clad layer is thicker than the barrier layers and the quantum well layers).

The inventors have found that the following problems have been addressed in manufacturing the semiconductor light-emitting device.

In the superlattice-structured light-emitting layer, if layers adjacent to the respective clad layers are quantum well layers, the following problems are encountered. When a clad layer is of the p-type and a quantum well layer is contiguous to such clad layer, the depth of the well of such quantum well layer differs from those of the other quantum well layers because the clad layer has a different energy level from a barrier layer. Therefore, there is a danger that the wavelengths of light will be shifted. Further, if a clad layer is of the n-type and a quantum well layer is contiguous to such clad layer, the well is hard to form in such quantum well layer because the energy level of the clad layer is lower than that of the quantum well layer. As a result, emission of light cannot be expected.

SUMMARY OF THE INVENTION

To overcome the aforementioned problems, a first aspect of the invention is applied to a semiconductor light-emitting device that includes:

a first semiconductor layer that is made of n-type GaN;

a light-emitting layer of superlattice structure that is formed on the first semiconductor layer by laminating a barrier layer being made of $In_{Y1} Ga_{1-Y1} N$ (Y1≧0) and a quantum well layer being made of $In_{Y2} Ga_{1-Y2} N$ (Y2>Y1 and Y2>0); and a second semiconductor layer that is made of p-type $Al_X Ga_{1-X} N$ (0.05<X<0.2), and in such a semiconductor light-emitting device, layers that are adjacent to clad layers are the barrier layers in the light-emitting layer. That is, the light-emitting layer is designed to have a barrier layer—a quantum well layer— . . . —a quantum well layer—a barrier layer.

It may be noted that the first semiconductor layer and the second semiconductor layer correspond to clad layers or optical guide layers in the following description. It may further be noted that impurities introduced due to the background at the time of growing the semiconductor layers such as the barrier layers and the quantum well layers are not intentional impurities.

However, when the inventors have examined again, the following problems have further been found out.

When the second clad layer is formed on the light-emitting layer of superlattice structure, the barrier layer that comes on top of the light-emitting layer (hereinafter referred to as the "uppermost barrier layer") becomes thin. The reason therefor is assumed to be as follows. Since the second clad layer is formed at higher temperatures than the uppermost barrier layer, the material of which the uppermost barrier layer is formed is blown away from the upper surface of the second clad layer at the time of forming the second clad layer.

It is not desirable that the uppermost barrier layer become thin, because the wavelengths of light are shifted toward the short wavelength side by the quantum effect.

Further, if the barrier layer is designed to be thin (e.g., to a thickness of some nanometers), there is a danger that no uppermost barrier layer substantially exists.

To overcome this problem, a second aspect of the invention is applied to a method of manufacturing a semiconductor light-emitting device that includes the steps of:

forming a first semiconductor layer that is made of $Al_X In_Y Ga_{1-X-Y} N$ (including X=0, Y=0, X=Y=0);

forming a light-emitting layer of superlattice structure that is formed on the first semiconductor layer by laminating a barrier layer being made of $In_{Y1} Ga_{1-Y1} N$ (Y1≧0) and a quantum well layer being made of $In_{Y2} Ga_{1-Y2} N$ (Y2>Y1 and Y2>0); and forming a second semiconductor layer that is made of $Al_A In_B Ga_{1-A-B} N$ (including A=0, B=0, A=B=0) on the light-emitting layer, wherein an uppermost barrier layer, which is an uppermost layer of the light-emitting layer, is formed thicker than the other barrier layers.

Further, a third aspect of the invention is applied to a method of manufacturing a semiconductor light-emitting device according to the second aspect of the invention, which is characterized in that at the time of forming the second semiconductor layer, an upper surface of the uppermost barrier layer is caused to disappear and the uppermost barrier layer is made to have substantially the same thickness as the other barrier layers.

Further, an object of the invention is to provide a semiconductor light-emitting device in which the peak wavelengths of emitted light do not vary even if an applied current is varied.

Another object of the invention is to provide a semiconductor light-emitting device having a narrow wavelength distribution, i.e., a semiconductor light-emitting device that emits light that is close to ideal monochromatic light.

Still another object of the invention is to provide a semiconductor light-emitting device that has high light-emitting efficiency and an active layer of superlattice structure exhibiting strong emission of light.

In the semiconductor light-emitting device according to the first aspect of the invention, layers that are adjacent to the first semiconductor layer and the second semiconductor layer are barrier layers in the light-emitting layer. Therefore, the shape of a quantum well, i.e., the potential wells in the quantum well layers closest to the respective semiconductor layers are substantially the same as those of the other quantum well layers. As a result, the wavelengths of light emitted from the respective quantum well layers become substantially the same.

Further, a crystal of the barrier layer made of $In_{Y1}Ga_{1-Y1}N$ in the light-emitting layer is grown on the first semiconductor layer made of n-type GaN. Since the indium mole fraction of the barrier layer is zero or relatively smaller than that of the quantum well layer, the composition of the barrier layer is closer to that of the first semiconductor layer. Therefore, the crystal of the light-emitting layer is hard to distort.

In a method of manufacturing a semiconductor light-emitting device according to the second aspect of the invention, the uppermost barrier layer is made thicker than the other barrier layers. Therefore, even if the material on the surface of the uppermost barrier layer is caused to disappear at the time of forming the second semiconductor layer, there is no likelihood that the entire part of the uppermost barrier layer will not substantially exist. In order to allow the uppermost barrier layer to exist, the thickness of the uppermost barrier layer must, of course, be designed while taking into consideration a part of thickness to be caused to disappear at the time of forming the second semiconductor layer.

According to the third aspect of the invention, the uppermost barrier layer is designed while taking into consideration a part of thickness to be caused to disappear at the time of forming the second semiconductor layer so that the uppermost barrier layer has the same thickness as the other barrier layers after the second semiconductor layer has been formed. As a result, the respective barrier layers have substantially the same thickness in the superlattice-structured light-emitting layer, which in turn contributes to preventing wave wavelength shift caused by the quantum effect.

Further, according to a mode of embodiment of the invention, the peak wavelengths of light emitted from the semiconductor light-emitting device remain substantially unchanged even if an applied current is changed.

Still further, according to another mode of embodiment of the invention, a wavelength distribution of light emitted from the semiconductor light-emitting device becomes narrow. That is, light close to ideal monochromatic light can be emitted from the semiconductor light-emitting device.

Still further, according to still another mode of embodiment of the invention, light-emitting efficiency is high and light-emitting strength is increased in the superlattice-structured light-emitting layer.

DETAILED DESCRIPTION OF THE PREFERRED MODES OF EMBODIMENTS

Modes of embodiment of the invention will now be described in more detail based on embodiments of the invention.

First Embodiment

Figure 1:
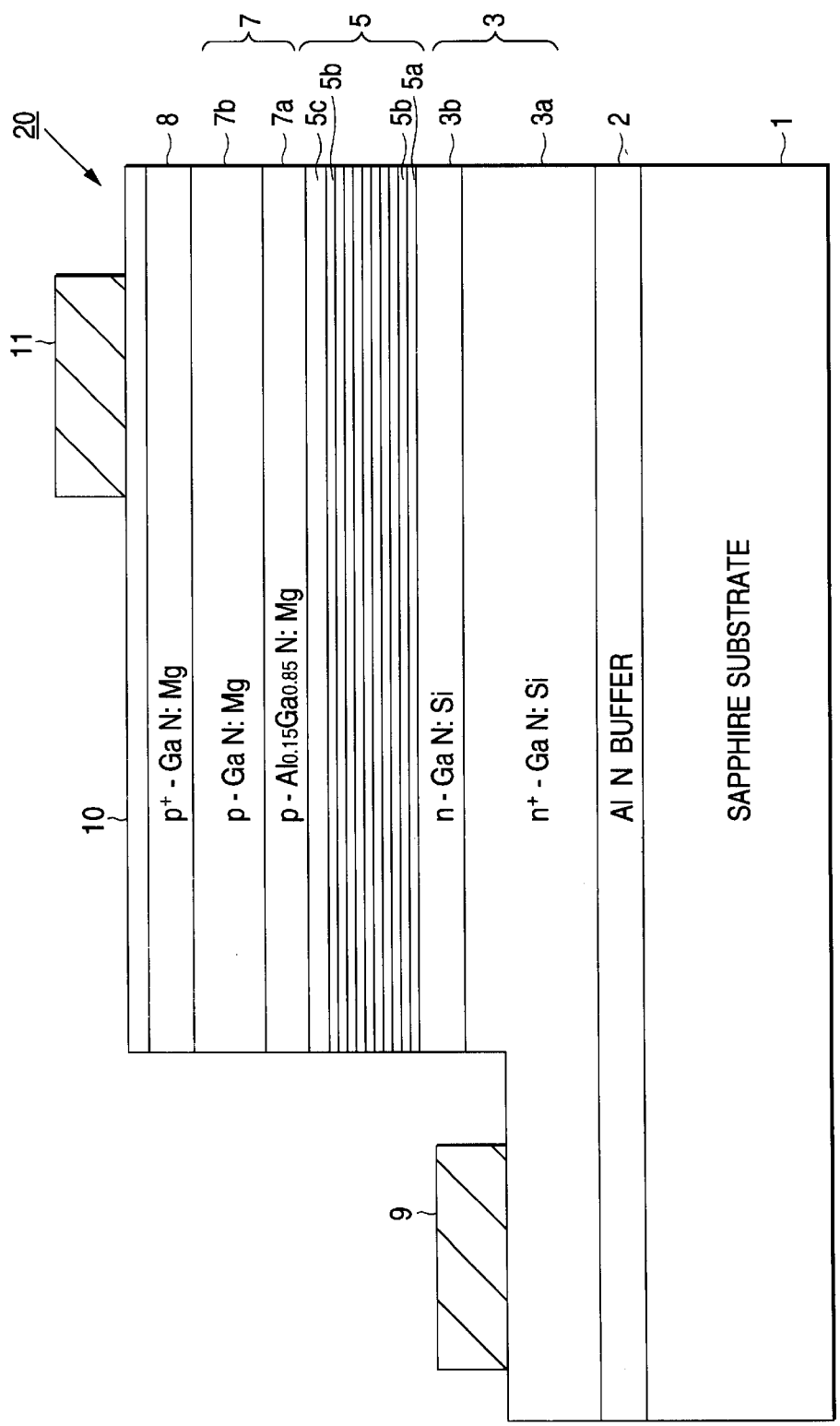
FIG. 1 is a sectional view of a light-emitting diode, which is an embodiment of the invention.

A semiconductor light-emitting device according to this embodiment is a blue light-emitting diode. FIG. 1 is a sectional view of a light-emitting diode 20, which is the first embodiment.

A 20 nm-thick buffer layer 2 made of AlN is formed on a plane a of a 100 µm-thick sapphire substrate 1. The thickness of the buffer layer 2 may be set to 20 to 50 nm, and the film is grown at 400° C.

An n-type semiconductor layer 3 is formed on the buffer layer 2 in two layers. The n layer 3 includes: a 2.5 µm-thick n⁺-GaN layer 3a with silicon doped at high density (carrier concentration is $2 \times 10^{18}/cm^3$); and a 0.5 µm-thick silicon-doped n-GaN layer 3b (a first clad layer (a first semiconductor layer), carrier concentration: $2 \times 10^{17}/cm^3$).

The n layer 3 may be formed of a compound semiconductor made of $Al_XIn_YGa_{1-X-Y}N$ (including X=0, X=Y, X=Y=0). The n layer 3 may also be designed as a single layer.

A light-emitting layer 5 of superlattice structure is formed on the n layer 3. The light-emitting layer 5 is formed by repetitively laminating a 3.5 nm-thick barrier layer 5a and a 3.5 nm-thick quantum well layer 5b. The barrier layer 5a is made of GaN having no intentional impurities doped. The quantum well layer 5b is made of $In_{0.16}Ga_{0.84}N$ having no intentional impurities doped. The repetition number is set to 5 in this embodiment. A 3.5 nm-thick barrier layer 5c that is formed on the uppermost is made of GaN having no intentional impurities doped.

In the aforementioned embodiment, the repetition number of the barrier layers 5a and the quantum well layers 5b is not particularly limited. The barrier layers 5a, 5c may be formed of a compound semiconductor made of $In_{Y1}Ga_{1-Y1}N$ (Y1≧0), and the quantum well layers 5b may be formed of a compound semiconductor made of $In_{Y2}Ga_{1-Y2}N$ (Y2≧Y1 and Y2>0). It is preferred that the thickness of the uppermost barrier layer 5c be substantially equal to those of the other barrier layers 5a from the viewpoint of eliminating the quantum effect.

The barrier layers 5a, 5c and the quantum well layers 5b may have impurities doped thereinto.

According to an examination carried out by the inventors, when the thickness of each quantum well layer 5b is set to 3 to 5 nm, it has been found that light is emitted from the light-emitting layer strongly. Such examination will be described below.

In the device according to the embodiment, the thickness of a quantum well layer is varied to 10 nm, 7 nm, 5 nm, and 3 nm, and luminous intensities obtained under these thicknesses are measured. It may be noted that the thickness of a barrier layer is varied similarly to that of the quantum well layer. By the term "luminous intensity" it is intended to mean strength of electroluminescence (unit: a.u.). According to the examination carried out by the inventors, when the thickness of the quantum well layer was set to 7 nm, the luminous intensity that is about 10 times the luminous intensity obtained when the thickness of the quantum well layer is set to 10 nm was obtained. Similarly, when the thickness of the quantum well layer was set to 5 nm, the luminous intensity that is about 60 times was obtained, and when set to 3 nm, the luminous intensity that is about 150 times was obtained.

It is understood from the above that it is preferred that the thickness of the quantum well layer be set to 3 to 5 nm when the barrier layer is made of nondoped GaN and the quantum well layer is made of nondoped InGaN. It is preferred that the thickness of the barrier layer be set to 3 nm or more.

In this embodiment it is the barrier layer 5a that is adjacent to the first clad layer 3b in the light-emitting layer 5 and it is the uppermost barrier layer 5c that is adjacent to the p-type second clad layer 7. Therefore, the shape of the quantum well, i.e., the potential wells in the quantum well layers 5b that are closest to the respective clad layers become substantially the same as those of the other quantum well layers. Hence, the wavelengths of light emitted from the respective quantum well layers become substantially the same.

The second clad layer (a second semiconductor layer) 7 having a wider bad gap than the barrier layer 5a is formed on the light-emitting layer 5 in two layers. The second clad layer 7 includes from the bottom: a 30.0 nm-thick magnesium doped p-$Al_{0.15}Ga_{0.85}N$ layer 7a (carrier concentration: 1–2×$10^{17}$/cm$^3$); and a 75.5 nm-thick magnesium-doped p-GaN layer (carrier concentration: 2×$10^{17}$/cm$^3$). The layer 7a mainly performs the electron confinement effect.

It is preferred that the thickness of an Al-containing clad layer 7a be set to 20 nm or more. Thicknesses that are less than 20 nm make electron confining effect by heterobarrier weak. It is not necessary to form the clad layer 7a to a thickness exceeding 100 nm. Further, the clad layer 7a composition is not limited to $Al_{0.15}Ga_{0.85}N$, but may include $Al_XGa_{1-X}N$ (0.05<X<0.2).

The second clad layer 7 may be formed of a compound semiconductor having the composition $Al_AIn_BGa_{1-A-B}N$ (including A=0, A=B, A=B=0). The second clad layer 7 may also be formed of a single layer.

A 25.0 nm-thick GaN layer 8 (carrier concentration: 1×$10^{17}$/cm$^3$) having magnesium doped at a higher density than the p-GaN layer 7b is formed on the second clad layer 7. This layer is provided to decrease contact resistance with respect to electrodes. It is preferred that the thickness of the GaN layer 8 be set to 20 to 50 nm. The thickness smaller than 20 nm weakens the effect of the contact layer and increases resistance. Further, it is not necessary to increase the thickness more than 50 nm.

An electrode pad 9 is made of Al, Ti or an alloy containing these metals.

Reference numeral 10 denotes a transparent electrode, which is formed so as to cover almost all the surface of the GaN layer 8. An electrode pad 11 is formed on the transparent electrode 10. The transparent electrode 10 and the electrode pad 11 may be made of Au, Pt, Pd, Ni, or an alloy containing these metals.

Then, a method of manufacturing the light-emitting diode 20 according to the embodiment will be described.

The respective semiconductor layers of the light-emitting diode is formed by the MOVPE method. This growing method is designed to grow desired crystals on a substrate by supplying ammonia gas and alkyl compound gases containing group III devices such as trimethylgallium (TMG), trimethylaluminum (TMA), and trymethylindium (TMI) to the substrate that has been heated to an appropriate temperature and by subjecting the substrate to a thermal decomposition process.

It may be noted that the flow rate and reaction time of the carrier gas, ammonia gas, and alkyl compound gas containing a group III device are appropriately adjusted in accordance with the desired crystal.

First, a single-crystal sapphire substrate 1 having a surface a as a main surface that is cleaned by an organic cleaning process and a heat treatment is attached to the susceptor within a not shown vapor-phase reaction system. Then, the sapphire substrate 1 is subjected to a vapor phase etching process at 1100° C. while introducing $N_2$ into the reaction system at atmospheric pressure.

Then, the buffer layer 2 made of AlN is formed on the substrate to a thickness of about 20 nm by decreasing the temperature to 400° C. and by supplying $N_2$, $NH_3$, and TMA.

Then, the lower layer 3a of the n-type semiconductor layer is formed by introducing $N_2$, silane, TMG, and $NH_3$. Further, the upper layer 3b is formed by decreasing the flow rate of silane.

Successively, a 3.5 nm-thick barrier layer 5a made of GaN is formed by keeping the temperature at 900° C. and by introducing $N_2$, TMG, and $NH_3$. Then, a 3.5 nm-thick quantum well layer 5b made of $In_{0.16}Ga_{0.84}N$ is formed by keeping the temperature at 750° C. and by introducing $N_2$, $NH_3$, TMG, and TMI.

By repeating this process, five layers of barrier layers 5a and five layers of quantum well layers 5b are obtained as shown in the drawing.

By adjusting the reaction time, the thicknesses of the barrier layers 5a and the quantum well layers 5b are adjusted.

The 14.0 nm-thick uppermost barrier layer 5c made of GaN is formed on the fifth quantum well layer 5b by keeping the temperature at 900° C. and by introducing $N_2$, TMG, and $NH_3$. As already described, the upper surface of the uppermost barrier layer 5c is caused to disappear at the time of forming the second clad layer 7. In this embodiment the thickness of the uppermost barrier layer 5c that was initially 14.0 nm was reduced to 3.5 nm after the second clad layer had been formed.

It is preferred that the uppermost barrier layer 5c be formed so that the thickness thereof is equal to the thickness of other barrier layers 5a after the second clad layer has been formed; i.e., the thickness is 3.5 nm.

Then, the 30 nm-thick magnesium-doped layer 7a made of p-$Al_{0.15}Ga_{0.85}N$ is formed by keeping the temperature at 1000° C. and by introducing $N_2$, $NH_3$, TMG, TMA, and $CP_2Mg$. Then, the 75.0 nm-thick magnesium-doped p-GaN layer 7b is also formed by keeping the temperature at 1000° C. and by introducing $N_2$, $NH_3$, TMG, and $CP_2Mg$. The second clad layer 7 is thus formed.

After the layer 7b has been formed, the uppermost layer 8 is formed by keeping the temperature at 1000° C. and by changing the flow rate of $Cp_2Mg$.

The second clad layer 7 and the uppermost layer 8 exhibit semi-insulating properties under this condition. Now, electron beams are irradiated uniformly onto the second clad layer 7 and the uppermost layer 8 using an electron beam irradiating apparatus. Electron beams are irradiated, e.g., at an acceleration voltage of about 10 kV, at a sample current of 1 $\mu A$, at a beam moving velocity of 0.2 nm/sec, with a beam diameter of 60 $\mu m$, and at a vacuum degree of $5.0 \times 10_{-5}$ Torr. As a result of such electron beam irradiation, the second glad layer 7 and the uppermost layer 8 are formed to be desired p-type layers.

The thus formed semiconductor wafer is subjected to a known etching process to obtain a semiconductor layer design shown in FIG. 1. The electrode pad 9 is formed on the semiconductor layer 3a by deposition, and then the Au-made transparent electrode 10 is deposited on the uppermost layer 8, and further the Au-made electrode pad 11 is deposited thereon.

The thus prepared semiconductor wafer is cut into unit devices, whereby desired blue light-emitting diodes are obtained.

According to an examination carried out by the inventors, the device according to the aforementioned embodiment exhibits the following characteristics.

Figure 2:
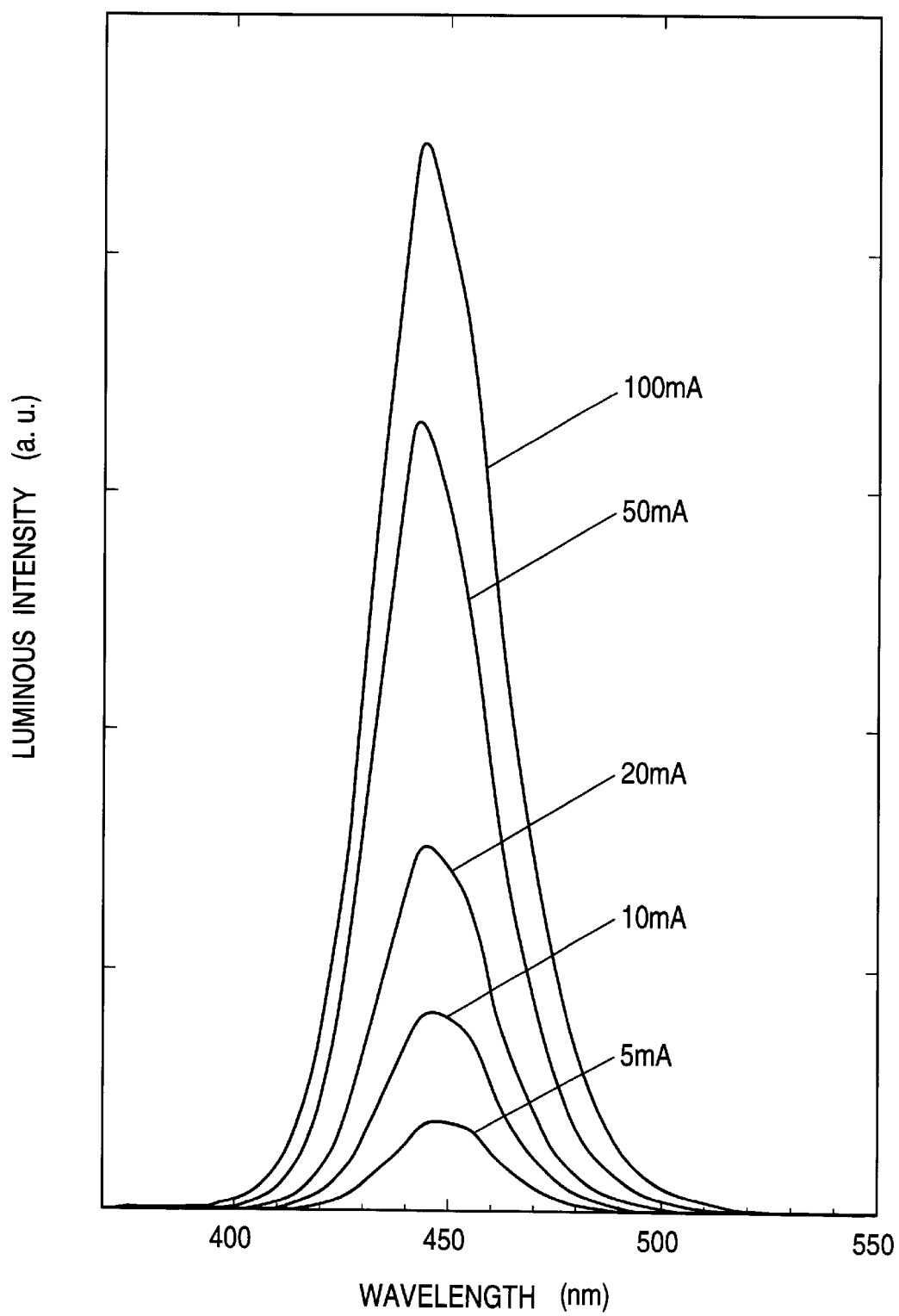
FIG. 2 is a diagram showing emission spectral changes observed when current is varied in the light-emitting diode, which is the embodiment of the invention.
Figure 3:
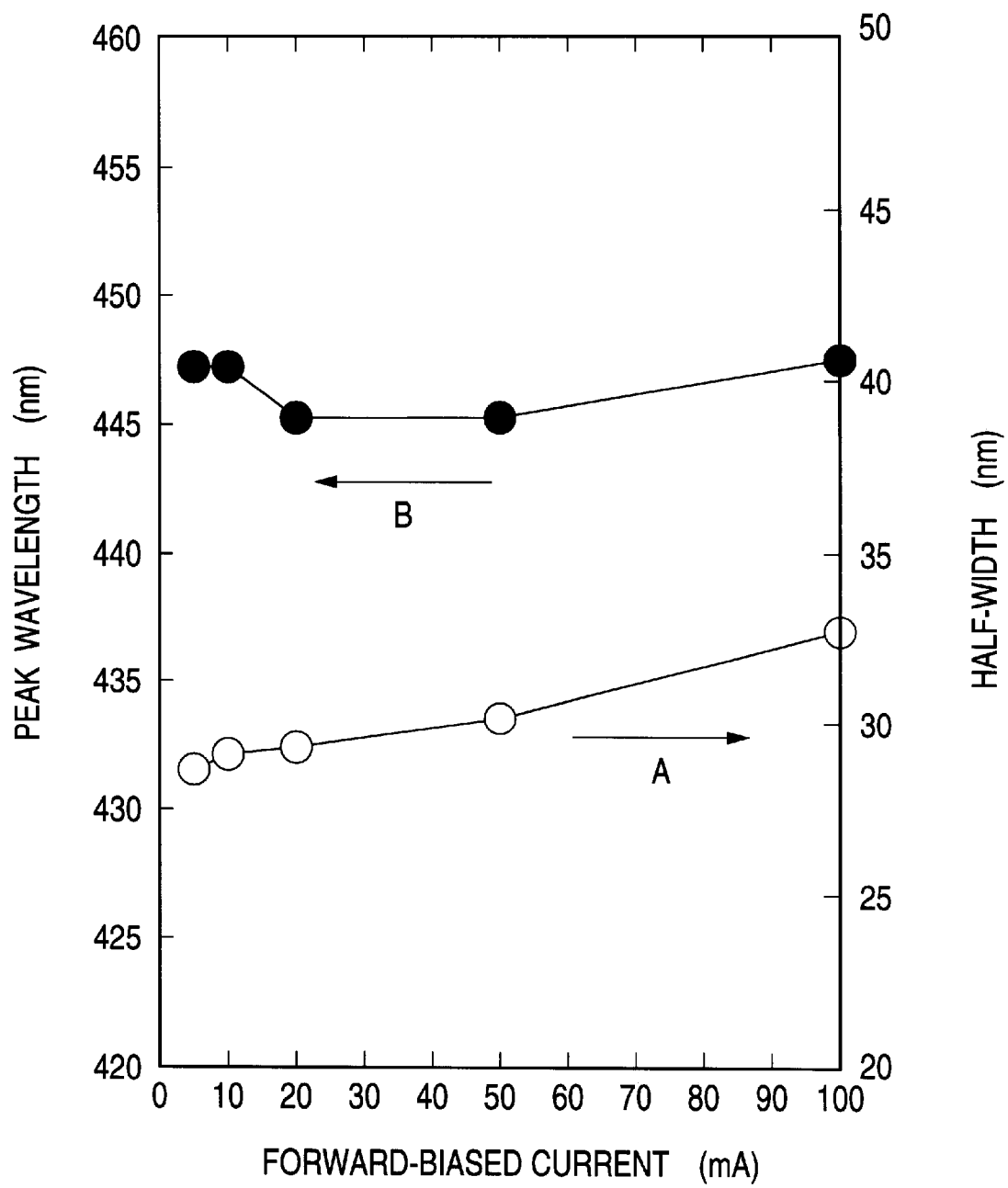
FIG. 3 is a diagram showing changes in peak wavelength and changes in half-width when current is similarly varied.

FIG. 2 shows emission spectral changes observed when forward-biased current applied to the device is varied. FIG. 3 is an analysis of the emission spectra of FIG. 2, and shows changes in peak wavelength and half-width observed when forward-biased current applied to the device is varied. In FIG. 3, portion A shows a case where the current is increased, and portion B shows a case where the current is decreased.

As is understood from these diagrams, the peak wavelengths do not substantially vary even if the current to be applied to the device is varied. That is, even if the current is varied within the range of from 5 to 100 mA, the peak wavelengths stay within the range of from 445 to 450 nm. Considering the current to be practically applied to the device, the forward-biased current should range from 5 to 50 mA, and a change in peak wavelength observed at the time of varying the current within such range will be 10 nm or less, or more specifically, about 5 nm or less. It may be particularly noted that the peak wavelengths remain substantially unchanged when the current is within the range of from 20 to 50 mA.

On the other hand, ordinary light-emitting devices exhibit their peak wavelengths shifted toward the short wavelength side when the applied current is increased, i.e., the applied voltage is increased. The following reasons are conceivable.

Semiconductor layers constituting a light-emitting layer of heterostructure contain impurities. In such semiconductor layers, carriers at the lowest energy level of the semiconductor layers are raised to an energy level formed by the impurities contained in the light-emitting layer when the applied voltage is increased. Since the energy level formed by the impurities is higher than the lowest energy level of the semiconductor layers, the wavelengths of light emitted as a result of the recombination of such carriers are shifted toward the short wavelength side.

Similarly, in a light-emitting layer having a single quantum well layer, carriers at the lowest energy level of the semiconductor layer are raised to an energy level formed by the impurities contained in the light-emitting layer when the applied voltage is increased. Therefore, the wavelengths of light emitted as a result of the recombination of such carriers are shifted toward the short wavelength side.

On the other hand, according to the semiconductor light-emitting device according to this embodiment, no impurities are doped into the light-emitting layer. Further, there are a plurality of quantum well layers (five layers in the embodiment). Therefore, when a high voltage is applied, carries at the lowest level of a quantum well are preferentially tunneled to unoccupied levels in other quantum wells that have the lowest energy levels or relatively low energy levels instead of being raised to a higher energy level in such quantum well, the other quantum wells being contiguous to such quantum well in the front and in the rear (i.e., vertically contiguous to such quantum well as viewed in the drawing). As a result, it is assumed that this prevents wavelength shift toward the short wavelength side.

It may be noted that it is preferred that the number of quantum well layers be set to 3 to 7 from the viewpoint of preventing wavelength shift.

Thus, the peak wavelengths stay substantially constant even if the magnitude of current is varied. This is desirable in terms of obtaining satisfactory light-emitting device characteristics.

The half-widths of the emission spectra also stay substantially constant independently of the applied current (5 to 100 mA), and the half-width values are 60 nm or less. The half-width change is even smaller within the practically applied current range (5 to 50 mA). The half-width change becomes still smaller when the applied current ranges from 20 to 50 mA.

From the fact that the half-widths of the emission spectra stay substantially constant, it is assumed that the recombination of carriers at the same energy level in the respective quantum well layers contributes to emitting light.

Thus, the fact that the half-widths of the emission spectra are maintained at levels of 60 nm or less independently of change in applied current means that a distribution of wavelengths of emitted light is narrow and therefore that emission of light is getting closer to ideal monochromatic light. As a result, a light-emitting device having high color purity can be obtained.

Second Embodiment

A semiconductor light-emitting device according to this embodiment is a green light-emitting diode.

The light-emitting diode according to this embodiment is distinguished from the light-emitting diode according to the first embodiment in that the quantum well layers have a composition of $In_{0.23}Ga_{0.77}N$. That is, the indium mole fraction of the quantum well layers is increased compared with that in the first embodiment. Such quantum well layers are formed by increasing the flow rate of TMI or the like similarly to the first embodiment.

According to an examination carried out by the inventors, the following characteristics are exhibited by the thus formed device according to the second embodiment.

Figure 4:
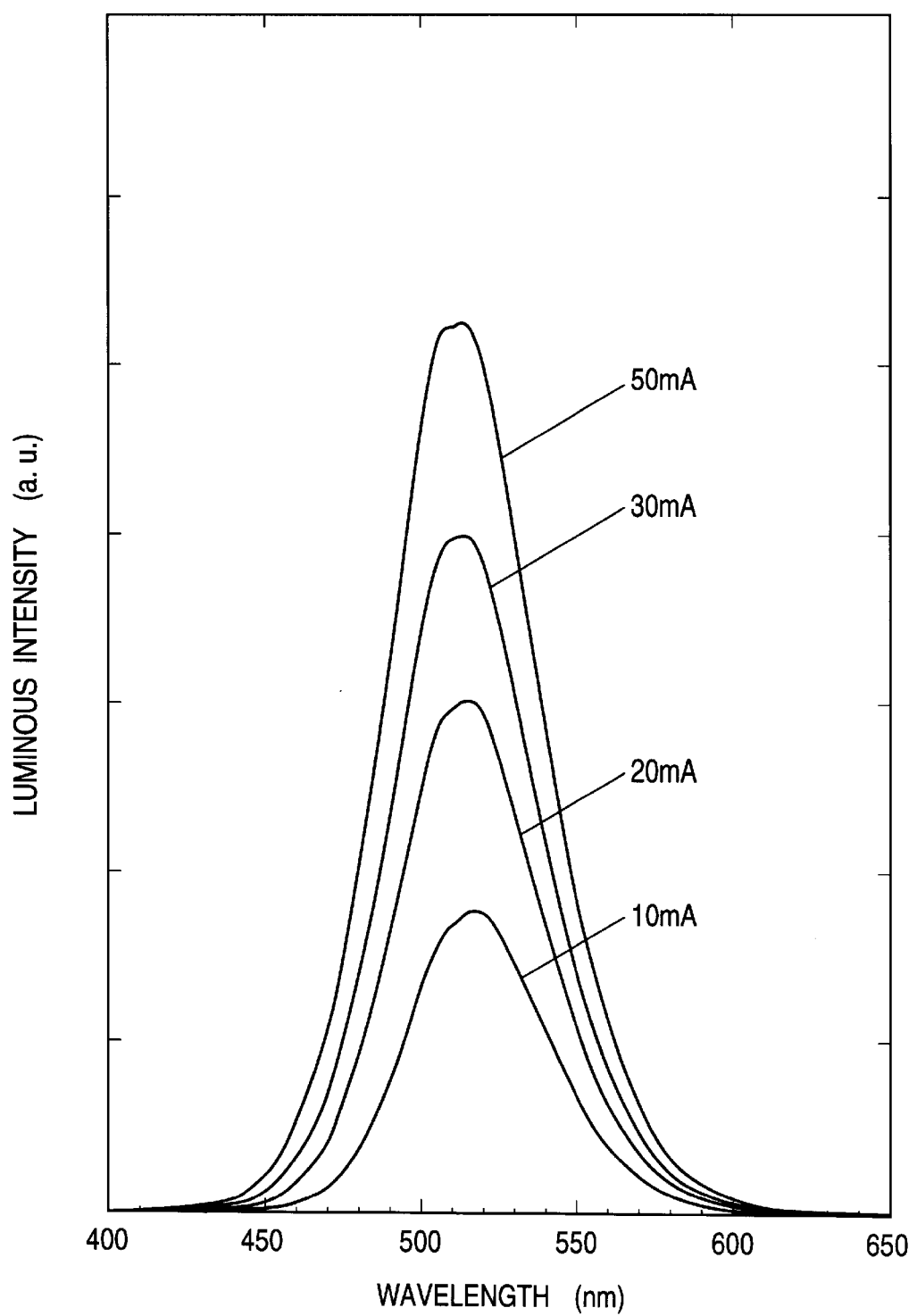
FIG. 4 is a diagram showing emission spectral changes observed when current is changed in a light-emitting diode, which is another embodiment of the invention.
Figure 5:
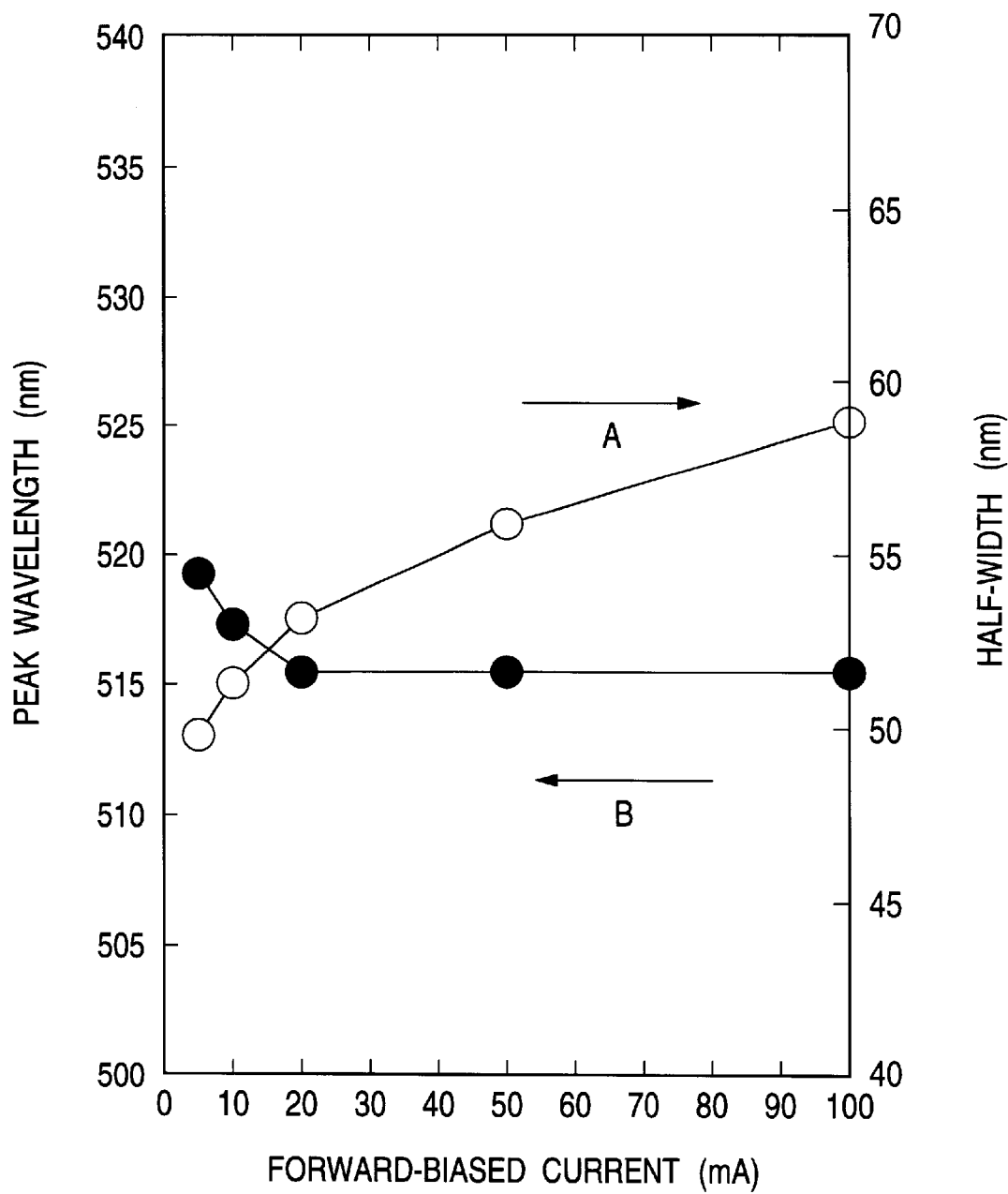
FIG. 5 is a diagram showing changes in peak wavelength and changes in half-width when current is similarly varied.

FIG. 4 shows emission spectral changes observed when forward-biased current applied to the device is varied. FIG. 5 is an analysis of the emission spectra of FIG. 4, and shows changes in peak wavelength and half-width observed when forward-biased current applied to the device is varied.

As is understood from these diagrams, the peak wavelengths do not substantially change even if the current applied to the device is varied. That is, even if the current is varied within the range of from 5 to 100 mA, the peak wavelengths stay within the range of from 515 to 520 nm. Considering the current to be practically applied to the device, the forward-biased current should stay within the range of from 5 to 50 mA, and a change in peak wavelength observed at the time of varying the current within such range will be 10 nm or less, or more specifically, about 5 nm or less. When the current ranges from 20 to 50 mA, or further from 20 to 100 mA, the peak wavelength is about 515 nm, which means that the peak wavelength substantially remains the same.

The half-widths of the emission spectra also stay substantially constant independently of the applied current (5 to 100 mA), and the half-width values are 60 nm or less, or more specifically, 35 nm or less. The half-widths substantially remain the same within the practically applied current range (5 to 50 mA). When the applied current ranges from 20 to 50 mA, the half-width change becomes even smaller.

The invention is not limited to the aforementioned modes of embodiment and embodiments whatsoever, but may read on various modes of modification that can be conceived by those skilled in the art within the scope of the invention as claimed.

The invention is, of course, applicable to laser diodes.

The following will be disclosed.

A semiconductor light-emitting device comprising:

a first semiconductor layer being made of $Al_X In_Y Ga_{1-X-Y}N$ (including X=0, Y=0, X=Y=0);

a light-emitting layer of superlattice structure being formed by laminating a barrier layer being made of $In_{Y1} Ga_{1-Y1}N$ (Y1≧0) and a quantum well layer being made of $In_{Y2} Ga_{1-Y2}N$ (Y2>Y1 and Y2>0) on the first semiconductor layer; and a second semiconductor layer being made of $Al_A In_B Ga_{1-A-B}N$ (including A=0, B=0, A=B=0) on the light-emitting layer, wherein layers contiguous to the first semiconductor layer and the second semiconductor layer in the light-emitting layer are the barrier layers.

The aforementioned semiconductor light-emitting device in which the barrier layer adjacent to the second semiconductor layer is thicker than the other barrier layers.

What is claimed is:

1. A semiconductor light-emitting device, comprising:

a first semiconductor layer made of group III-V gallium nitride compound semiconductor doped with impurities of high density and having n-type conduction;

a second semiconductor layer laminated on said first semiconductor layer, said second semiconductor layer being made of group III-V gallium nitride compound semiconductor doped with impurities of lower density than said first semiconductor layer and having n-type conduction;

a light-emitting layer of superlattice structure laminated on said second semiconductor layer, said light-emitting layer including a plurality of barrier layers of $In_{Y1} Ga_{1-Y1}N$ (Y1≧0) and a plurality of quantum well layers of $In_{Y2} Ga_{1-Y2}N$ (Y2>Y1, Y2>0) alternately laminated with each other;

a third semiconductor layer laminated on said light-emitting layer, said third semiconductor layer being made of group III-V gallium nitride compound semiconductor doped with impurities and having p-type conduction, said third semiconductor layer having a broader band gap than said barrier layer of said light-emitting layer;

a fourth semiconductor layer laminated on said third semiconductor layer, said fourth semiconductor layer being made of group III-V gallium nitride compound semiconductor doped with impurities of higher density than said third semiconductor layer and having p-type conduction;

a first electrode disposed on and electrically coupled with said first semiconductor layer; and a second electrode disposed on and electrically coupled with said fourth semiconductor layer.

2. A semiconductor light-emitting device according to claim 1, wherein at least one of said barrier layer and said quantum well layer does not contain impurities intentionally doped.

3. The semiconductor light-emitting device according to claim 1, wherein a thickness of the quantum well layer is set to 3 to 5 nm.

4. A semiconductor light-emitting device, comprising:

a first semiconductor layer being made of a group III nitride;

a light-emitting layer of superlattice structure being formed by laminating a barrier layer and a quantum well layer being made of III nitride semiconductors on the first semiconductor layer; and a second semiconductor layer being made of group III nitride on the light-emitting layer, wherein when an applied current is varied within a range of from 5 to 50 mA, changes in the peak wavelengths of emitted light are 10 nm or less.

5. The semiconductor light-emitting device according to claim 4, wherein a half-width of an emission spectrum is 60 nm or less with respect to the applied current ranging from 5 to 50 nm.

6. The semiconductor light-emitting device according to claim 4, wherein the second semiconductor layer is made of p-type magnesium-doped $Al_X Ga_{1-X}N$ (0.05<X<0.2) whose thickness ranges from 20 to 100 nm.

7. The semiconductor light-emitting device according to claim 4, wherein the quantum well layer is made of $In_{Y2} Ga_{1-Y2}N$ (Y2>Y1 and Y2>0) and the barrier layer is made of GaN.

* * * * *